US011899181B2

United States Patent
Guo

(10) Patent No.: US 11,899,181 B2
(45) Date of Patent: Feb. 13, 2024

(54) LITHOGRAPHY PROJECTION OBJECTIVE

(71) Applicant: SHANGHAI MICRO ELECTRONICS EQUIPMENT (GROUP) CO., LTD., Shanghai (CN)

(72) Inventor: Yinzhang Guo, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 270 days.

(21) Appl. No.: 17/419,967

(22) PCT Filed: Dec. 30, 2019

(86) PCT No.: PCT/CN2019/129760
§ 371 (c)(1),
(2) Date: Jun. 30, 2021

(87) PCT Pub. No.: WO2020/140859
PCT Pub. Date: Jul. 9, 2020

(65) Prior Publication Data
US 2022/0075159 A1 Mar. 10, 2022

(30) Foreign Application Priority Data
Dec. 30, 2018 (CN) .......................... 201811648652.0

(51) Int. Cl.
*G02B 13/00* (2006.01)
*G02B 9/60* (2006.01)
*G03F 7/00* (2006.01)

(52) U.S. Cl.
CPC ........... *G02B 13/0045* (2013.01); *G02B 9/60* (2013.01); *G03F 7/70241* (2013.01)

(58) Field of Classification Search
CPC ......... F16C 19/06; G10L 13/08; G06V 20/40; F16J 15/3232; F16J 15/3284;
(Continued)

(56) References Cited

U.S. PATENT DOCUMENTS 5,555,479 A 9/1996 Nakagiri
2002/0149855 A1* 10/2002 Schuster .............. G02B 13/143
359/728
(Continued)

FOREIGN PATENT DOCUMENTS

CN 101369050 2/2009
CN 101517488 8/2009
(Continued)

OTHER PUBLICATIONS

Office Action issued in Japanese Application No. 2021-538724, dated Jun. 22, 2022.
(Continued)

*Primary Examiner* — Deoram Persaud
(74) *Attorney, Agent, or Firm* — Michael Best & Friedrich LLP

(57) ABSTRACT

Provided a lithography projection objective includes: first lens group, second lens group, third lens group, fourth lens group, and fifth lens group, wherein first lens group, second lens group, third lens group, fourth lens group, and fifth lens group are sequentially arranged along an optical axis; first lens group and third lens group each has negative optical power, second lens group and fourth lens group each has positive optical power, fifth lens group has optical power of 0, sum optical power of first lens group, second lens group, third lens group, fourth lens group, and fifth lens group is 0; lithography projection objective further includes diaphragm; and first lens group, third lens group, and fourth lens group each comprises aspheric lenses, one aspheric lens thereof includes an aspherical surface; and a number of aspheric lenses is greater than or equal to 4 and less than or equal to 8.

15 Claims, 10 Drawing Sheets

(58) Field of Classification Search
CPC ......... H04N 21/4351; H04N 21/44008; H04N 21/854; G03F 7/20; G03F 7/70241; G03F 7/70308; G02B 13/0045; G02B 13/18; G02B 3/04; G02B 9/60; G02B 9/64; G02B 2003/0093; G02B 3/0087; G02B 13/00; G02B 13/14; G02B 13/22
See application file for complete search history.

(56) References Cited

U.S. PATENT DOCUMENTS

| | | | | |
|---|---|---|---|---|
| 2003/0007138 | A1* | 1/2003 | Shigematsu | G03F 7/70258 359/759 |
| 2005/0083583 | A1* | 4/2005 | Hudyma | G03F 7/70241 359/649 |
| 2007/0268594 | A1* | 11/2007 | Dodoc | G03F 7/70241 359/649 |
| 2008/0043345 | A1* | 2/2008 | Dodoc | G02B 13/143 359/770 |
| 2008/0278799 | A1* | 11/2008 | Beder | G03F 7/70225 359/489.18 |
| 2009/0034061 | A1* | 2/2009 | Dodoc | G02B 17/08 359/364 |
| 2020/0310256 | A1* | 10/2020 | An | G03F 7/20 |

FOREIGN PATENT DOCUMENTS

| | | |
|---|---|---|
| CN | 101587230 | 11/2009 |
| CN | 101849205 | 9/2010 |
| CN | 102331616 A | 1/2012 |
| CN | 102662307 | 9/2012 |
| CN | 102981249 | 3/2013 |
| CN | 107422464 | 3/2013 |
| CN | 103499876 | 1/2014 |
| CN | 103616757 | 3/2014 |
| CN | 104035187 | 9/2014 |
| CN | 104199175 | 12/2014 |
| CN | 105527701 | 4/2016 |
| CN | 108292038 | 7/2018 |
| JP | 2005055625 | 3/2005 |
| JP | 2007079015 | 3/2007 |
| JP | 2008527403 A | 7/2008 |
| JP | 2017021122 | 1/2017 |
| JP | 2018021951 | 2/2018 |
| TW | 521321 | 5/2016 |

OTHER PUBLICATIONS

Office Action issued in Taiwanese Application No. 108148443, dated Oct. 26, 2020.
PCT/CN2019/129760 International Search Report dated Apr. 8, 2020.

* cited by examiner

LITHOGRAPHY PROJECTION OBJECTIVE

CROSS-REFERENCE TO RELATED APPLICATIONS

This is a National Stage Application filed under 35 U.S.C. 371 based on International Patent Application No. PCT/CN2019/129760, filed on Dec. 30, 2019, which claims priority to Chinese Patent Application No. 201811648652.0 filed on Dec. 30, 2018 the disclosures of both of which are incorporated herein by reference in their entireties.

TECHNICAL FIELD

Embodiments of the present application relate to lithography technologies and, for example, to a lithography projection objective.

BACKGROUND

Lithography is a technology that uses light to project and copy mask patterns. An integrated circuit is made by a lithography apparatus. With an aid of the lithography apparatus, figures with different mask patterns are imaged onto a substrate such as a silicon wafer or a liquid crystal display (LCD) panel, which is configured to manufacture a series of structures such as integrated circuits, thin film magnetic heads, liquid crystal display panels, or micro-electro-mechanical system (MEMS). In the past few decades, lithography technology has been continuously developed to meet needs of smaller line size, larger exposure area, higher reliability and productivity, and lower cost.

High imaging performance requires that the lithography projection objective can achieve a larger numerical aperture (for example, greater than a numerical aperture 0.5), and an aberration of the imaging is controlled within a reasonable range. In some application scenarios, high imaging performance also requires that the projection objective can be applied to a longer wavelength (for example, greater than or equal to 193 nm). The lithography projection objective in the related art needs to use more aspheric lenses under high imaging performance requirements, and the processing cost is high.

SUMMARY

Embodiments of the present application provide a lithography projection objective to reduce the number of aspheric lenses and reduce the processing cost.

Embodiments of the present application provide a lithography projection objective, and the lithography projection objective includes: a first lens group, a second lens group, a third lens group, a fourth lens group, and a fifth lens group, wherein the first lens group, the second lens group, the third lens group, the fourth lens group, and the fifth lens group are sequentially arranged along an optical axis; the first lens group and the third lens group each has a negative optical power, the second lens group and the fourth lens group each has a positive optical power, the fifth lens group has an optical power of 0, a sum optical power of the first lens group, the second lens group, the third lens group, the fourth lens group, and the fifth lens group is 0; the lithography projection objective further includes an aperture stop; and the first lens group, the third lens group, and the fourth lens group each includes aspheric lenses, one aspheric lens of the aspheric lenses includes an aspherical surface, and a number of the aspheric lenses is greater than or equal to 4 and less than or equal to 8.

In an embodiment, an aspheric deviation degree of each the aspheric lenses in the first lens group and the third lens group is less than 0.5 mm; and an aspheric deviation degree of at least one aspheric lens in the fourth lens group is greater than or equal to 0.5 mm; or, an aspheric deviation degree of each the aspheric lenses in the first lens group and the fourth lens group is less than 0.5 mm, and an aspheric deviation degree of at least one aspheric lens in the third lens group is greater than or equal to 0.5 mm;

where an aspheric deviation degree of an aspheric lens is an axial distance between an aspheric surface of the aspheric lens and a best-fitting spherical surface.

In an embodiment, at least one lens in the fourth lens group has a negative optical power.

In an embodiment, at least one lens in the first lens group has a positive optical power.

In an embodiment, the second lens group comprises a plurality of lenses each having a positive optical power; an optical power value of the lenses having a positive optical power in the first lens group is smaller than an optical power value of any lens in the second lens group.

In an embodiment, the first lens group and the third lens group each includes a meniscus lens.

In an embodiment, the first lens group and the fourth lens group include at least two meniscus lenses in total.

In an embodiment, the third lens group includes at least two aspheric lenses.

In an embodiment, the aperture stop is located between two adjacent lenses in the fourth lens group.

In an embodiment, the first lens group comprises three lenses, and two lenses among the three lenses of the first lens group are aspherical lenses; the second lens group comprises four lenses; the third lens group comprises three lenses, and two lenses among the three lenses of the third lens group are aspherical lenses; the fourth lens group comprises seven lenses, and three or four lenses among the seven lenses of the fourth lens group are aspherical lenses; and the fifth lens group comprises two lenses.

In an embodiment, a light incident surface of any lens in the fifth lens group and a light emitting surface of any lens in the fifth lens group are plane.

In an embodiment, the first lens group includes an anamorphic lens compensator, the anamorphic lens compensator is a lens in the first lens group, a range of an aperture-thickness ratio of the anamorphic lens compensator is 9 to 10, and the aperture-thickness ratio is a ratio of a maximum aperture of a lens to a thickness of a lens; and an effective aperture of the first surface of the anamorphic lens compensator is $\phi_1$, and an effective aperture of the second surface of the anamorphic lens compensator is $\phi_2$, where the second surface of the anamorphic lens compensator is located between the first surface of the anamorphic lens compensator and the second lens group, and $\phi_2 - \phi_1 > 20$ mm.

In an embodiment, light emitted by an Argon Fluoride (ArF) excimer laser and light emitted by a Krypton Fluoride (KrF) excimer laser are applicable to the lithography projection objective.

In an embodiment, the maximum image-side numerical aperture of the lithography projection objective is 0.82.

In an embodiment, an object-image conjugate distance of the lithography projection objective is less than or equal to 1100 mm.

DETAILED DESCRIPTION

Figure 1:
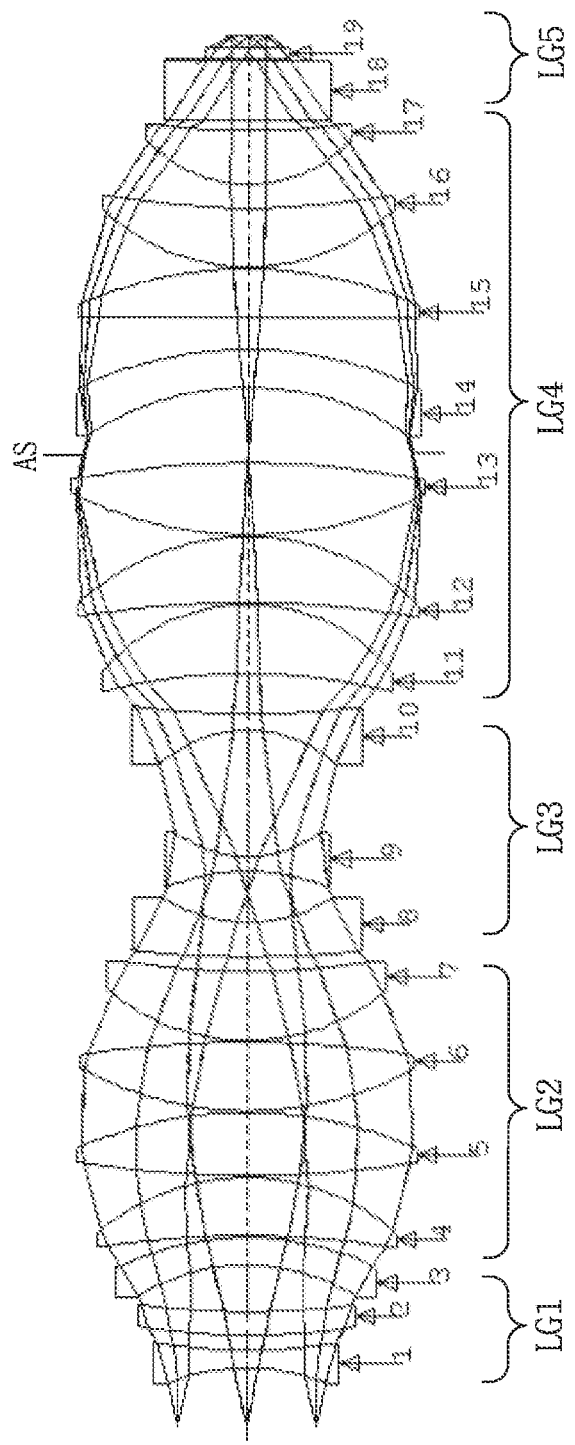
FIG. 1 is a schematic diagram of a lithography projection objective according to an embodiment of the present application.

Hereinafter the present application will be further described in detail in conjunction with the drawings and embodiments. It can be understood that the specific embodiments set forth below are intended to illustrate but not to limit the present application. For convenience of description, only part, not all, of the structures related to the present application are illustrated in the drawings.

Embodiment 1

FIG. 1 is a schematic diagram of a lithography projection objective according to an embodiment of the present application. Referring to FIG. 1, the lithography projection objective includes a first lens group LG1, a second lens group LG2, a third lens group LG3, a fourth lens group LG4 and a fifth lens group LG5 arranged in sequence along an optical axis. The first lens group LG1 and the third lens group LG3 each has a negative optical power, the second lens group LG2 and the fourth lens group LG4 each has a positive optical power, the fifth lens group has an optical power LG5 of 0, and a sum optical power of the first lens group LG1, the second lens group LG2, the third lens group LG3, the fourth lens group LG4, and the fifth lens group LG5 is 0. The first lens group LG1 is a most front end (incident end, close to an object plane) of the lithography projection objective, and the fifth lens group LG5 is a rearmost end (emitting end, close to an image plane) of the lithography projection objective, and the third lens group LG3 is located at a waist portion of the lithography projection objective. The first lens group LG1 and the third lens group LG3 each has a negative optical power, and the first lens group LG1 and the third lens group LG3 may mainly include a negative lens with a negative optical power. These negative lenses each has a negative optical power and appears in a region with a relatively small spot diameter in an optical path of the lithography projection objective, so that the first lens group LG1 and the third lens group LG3 may use lenses with relatively small effective apertures, which is conducive to correct a field curvature in an aberration. The lithography projection objective may be an optical system structure with a single waist portion. The waist portion represents a position where an aperture of the lens is contracted, so an effective aperture of a light spot passing through the corresponding lens is reduced. The aperture of the lens in the embodiments of the present application refers to an effective clear aperture of the lens.

The optical power is equal to a difference between an image-side beam convergence and an object-side beam convergence, which represents an ability of the optical system to deflect light. The greater an absolute value of the optical power, the stronger a bending ability to light, and the smaller the absolute value of the optical power, the weaker the bending ability to light. When the optical power is positive, the refraction of light is convergent; when the optical power is negative, the refraction of light is divergent. The optical power may be used to characterize a certain refractive surface of a lens (that is, a surface of the lens), to characterize a certain lens, or to characterize a system formed by a plurality of lenses (that is, a lens group). The closer the sum optical power of the first lens group LG1, the second lens group LG2, the third lens group LG3, the fourth lens group LG4 and the fifth lens group LG5 is to 0, the smaller a telecentric error of a double telecentric structure constituted by the first lens group LG1, the second lens group LG2, the third lens group LG3, the fourth lens group LG4 and the fifth lens group LG5 is. In the embodiments of the present application, the sum optical power of the first lens group LG1, the second lens group LG2, the third lens group LG3, the fourth lens group LG4, and the fifth lens group LG5 is 0, which is beneficial to reducing the difficulty of image quality correction of the lithography projection objective with high numerical aperture. The lithography projection objective also includes an aperture stop (AS). The effective clear aperture of the lithography projection objective may be adjusted by adjusting the aperture stop (AS), so that the numerical aperture of the lithography projection objective may be adjusted by adjusting the aperture stop (AS) to adapt to different lithography projection objective application scenes.

The first lens group LG1, the third lens group LG3, and the fourth lens group LG4 all include aspheric lenses. One aspheric lens includes an aspheric surface, and the other surface of the aspheric lens is a spherical surface or a plane surface. Because the processing and inspection difficulty of an aspheric lens with only one aspheric surface is much lower than that of an aspheric lens with two aspheric surfaces, setting the aspheric lens to include an aspheric surface reduces the manufacturing and measurement cost of the aspheric lens. The number of the aspheric lenses is greater than or equal to 4 and less than or equal to 8. An aspheric lens is a lens having an aspheric surface. The term "aspheric surface" as used herein should be understood as an aspheric surface with a maximum axial distance of more than 2 μm between the aspheric surface and the best-fit spherical surface. This definition is used to exclude spherical surfaces with desired deformations and aspheric surface parts that are usually introduced to correct aberrations after the manufacture of the lens/projection optical system. These aberrations are typically due to the manufacturing process and not inherent to the specific design of the projection optical system.

The lithography projection objective provided by the embodiments of the present application includes five lens groups, and each lens group includes at least two lenses, and all of them adopt a refraction method to achieve light control. The aspheric lens in the embodiments of the present application has only one aspheric surface, which is beneficial to reduce the manufacturing and measurement cost of the aspheric lens. In addition, the number of the aspheric lenses in the embodiments of the present application is greater than or equal to 4 and less than or equal to 8, and fewer aspheric lenses are used, thereby reducing the number of aspheric lenses and reducing processing costs.

In an embodiment, a maximum image-side numerical aperture of the lithography projection objective provided by the embodiments of the present application may reach 0.82, which is a high numerical aperture lithography projection objective. Since the lithography projection objective also includes an aperture stop (AS), the numerical aperture of the lithography projection objective may be 0-0.82 by adjusting the aperture stop (AS).

In the field of ultraviolet lithography, a refractive index of the lens increases as a wavelength becomes shorter. For example, the refractive index of fused silica material is 1.56 in the 193 nm band and 1.508 in the 248 nm band. When requirements of the numerical aperture, the view field and the aberration of the lithography projection objective are fixed, the lithography projection objective that support a longer wavelength is more difficult to design than the lithography projection objective that support a shorter wavelength. In an embodiment, the lithography projection objective provided by the embodiments of the present application may be designed based on a light (248 nm) emitted by a KrF excimer laser. Therefore, the light emitted by the KrF excimer laser is applicable to the lithography projection objective provided by the embodiments of the present application, that is, the light emitted by the KrF excimer laser is used as the exposure beam of the lithography projection objective. In other embodiment, a light emitted by an ArF excimer laser is applicable to the lithography projection objective, that is, the light emitted by the ArF excimer laser is used as the exposure beam of the lithography projection objective.

In an embodiment, referring to FIG. 1, an aspheric deviation degree of each the aspheric lenses in the first lens group LG1 and the third lens group LG3 is less than 0.5 mm; and an aspheric deviation degree of at least one aspheric lens in the fourth lens group LG4 is greater than or equal to 0.5 mm. The aspheric deviation degree of the aspheric lens is an axial distance between the aspheric surface of the aspheric lens and the best-fitting spherical surface. In an embodiment, the best-fitting spherical surface is a spherical surface closest to the aspherical surface, and a deviation between the spherical surface and the aspherical surface in the direction of the optical axis is the smallest. In an embodiment, the best-fitting spherical surface may be an envelope sphere that span vertices and edges of the aspheric surface. On one hand, a highly aspheric lens (a highly aspheric lens is a lens with an aspheric surface deviation greater than or equal to 0.5 mm) has a better aberration correction ability. On the other hand, the greater the aspheric surface deviation degree is, the more difficult it is to manufacture and detect the aspheric surface; the smaller the aspheric surface deviation degree is, the less difficult it is to manufacture and detect the aspheric surface. The difficulty of detection is mainly reflected in the design and manufacturing cost of computer-generated hologram (CGH) used for correction in the surface interferometers detection of high-precision lens surface. The design and manufacturing cost of the computer-generated hologram used in the surface interferometers detection of the surface of the highly aspheric lens is very high. In other embodiments, an aspheric deviation degree of each the aspheric lenses in the first lens group LG1 and the fourth lens group LG4 is less than 0.5 mm; and an aspheric deviation degree of at least one aspheric lens in the third lens group LG3 is greater than or equal to 0.5 mm. The embodiments of the present application not only ensures that the lithography projection objective has good aberration correction capability, but also reduces the overall manufacturing cost of the aspheric lens in the lithography projection objective.

In an embodiment, referring to FIG. 1, the first lens group LG1 includes a first lens 1, a second lens 2, and a third lens 3 that are sequentially arranged along the optical axis. The third lens group LG3 includes an eighth lens 8, a ninth lens 9, and a tenth lens 10 that are sequentially arranged along the optical axis. The eighth lens 8, the ninth lens 9 and the tenth lens are all negative lenses with negative optical power. The fourth lens group LG4 includes an eleventh lens 11, a twelfth lens 12, a thirteenth lens 13, a fourteenth lens 14, a fifteenth lens 15, a sixteenth lens 16 and a seventeenth lens 17 that are sequentially arranged along the optical axis. The sixteenth lens 16 in the fourth lens group LG4 is a highly aspherical lens. The aspherical deviation degrees of the first lens 1 and the second lens 2 in the first lens group LG1, the ninth lens 9, the tenth lens 10, and the eleventh lens 11 in the third lens group LG3, and the fourteenth lens 14 in the fourth lens group LG4 are less than 0.5 mm.

In an embodiment, referring to FIG. 1, at least one lens in the first lens group LG1 has a positive optical power. Since the first lens group LG1 has a negative optical power, and the first lens group LG1 may mainly include a negative lens with negative optical power. If all the lenses used in the first lens group LG1 are negative lenses of negative optical power, an aberration is not easily eliminated for the first lens group LG1. In the embodiments of the present application, at least one lens with positive optical power is provided in the first lens group LG1 to eliminate aberrations better.

In an embodiment, referring to FIG. 1, the first lens 1 and the third lens 3 are negative lenses with negative optical power, and the second lens 2 is a positive lens with positive optical power.

In an embodiment, referring to FIG. 1, the second lens group LG2 includes a plurality of lenses having positive optical power; an optical power value of the lenses having a positive optical power in the first lens group LG1 is smaller than an optical power value of any lens in the second lens group LG2. The optical power value of the lens with positive optical power in the first lens group LG1 is smaller, the lens with positive optical power in the first lens group LG1 does not have great influence on the optical power of the first lens group LG1 and the lithography projection objective, so that the fine adjustment effect is achieved, which is beneficial to realize that the sum optical power of the first lens group LG1, the second lens group LG2, the third lens group LG3, the fourth lens group LG4 and the fifth lens group LG5 is 0.

In an embodiment, referring to FIG. 1, the second lens group LG2 includes a fourth lens 4, a fifth lens 5, a sixth lens 6, and a seventh lens 7, which are sequentially arranged along the optical axis, and the fourth lens 4, the fifth lens 5, the sixth lens 6, and the seventh lens 7 are all positive lenses having positive optical power. The optical power of the second lens 2 is smaller than that of the fourth lens 4, the fifth lens 5, the sixth lens 6, and the seventh lens 7.

In an embodiment, referring to FIG. 1, at least one lens in the fourth lens group LG4 has a negative optical power. Since the fourth lens group LG4 has positive optical power, and the fourth lens group LG4 may mainly include a positive lens with positive optical power. If all the lenses used in the fourth lens group LG4 are positive lenses of positive optical power, an aberration is not easily eliminated for the fourth lens group LG4. In the embodiments of the present application, at least one lens with negative optical power is provided in the fourth lens group LG4 to better eliminate aberrations.

In an embodiment, referring to FIG. 1, the eleventh lens 11, the twelfth lens 12, the thirteenth lens 13, the fifteenth lens 15, the sixteenth lens 16, and the seventeenth lens 17 are all positive lenses with positive optical power. The fourteenth lens 14 is a negative lens with negative optical power.

In an embodiment, referring to FIG. 1, the first lens group LG1 and the third lens group LG3 each includes a meniscus lens. The meniscus lens is generally composed of two spherical surfaces with a small radius of curvature and a little numerical difference. The meniscus lens presents a crescent shape and is configured for aberration correction. Compared with ordinary spherical lenses, meniscus lenses are difficult and costly to process. The first lens group LG1 and the third lens group LG3 have negative optical power. The lenses in the first lens group LG1 and the third lens group LG3 appear in the region of the lithography projection objective with a relatively small spot aperture, so the meniscus lens is arranged in the first lens group LG1 and the third lens group LG3, which is beneficial to reduce the aperture of the meniscus lens, reduce the processing difficulty and processing cost of the meniscus lens, and thereby reduce the processing cost of the lithography projection objective.

In an embodiment, referring to FIG. 1, the first lens group LG1 and the third lens group LG3 include at least two meniscus lenses in total. Due to the high processing difficulty and processing cost of the meniscus lens, the number of meniscus lenses used in the lithography projection objective provided in the embodiments of the present application is small, so the processing cost of the lithography projection objective can be reduced.

In an embodiment, referring to FIG. 1, the third lens 3 in the first lens group LG1 is a meniscus lens, and the fourteenth lens 14 in the fourth lens group LG4 is a meniscus lens.

The meniscus lens used in the embodiments of the present application may also satisfy a requirement that a concentricity of the meniscus lens is less than 100 mm, where the concentricity of the meniscus lens is a distance between the center points of the two surfaces of the meniscus lens. First of all, because the center of the spherical surface corresponding to the front surface (the front surface is a spherical surface) and the center of the spherical surface corresponding to the back surface (the back surface is a spherical surface) are very close, the optical power of the meniscus lens is very small. The light of the central view field and the light of the edge view field of the meniscus lens may form an optical path difference, so that the meniscus lens can achieve corrections such as field curvature or advanced aberrations. In addition, during the processing of the meniscus lens, since the center of the spherical surface corresponding to the front surface and the center of the spherical surface corresponding to the back surface are very close, it is not conducive to optical centering, and the centering and edging process of the lens is not good. The concentricity of the meniscus lens provided by the embodiments of the present application is less than 100 mm, which can not only realize the correction of aberration, but also ensure the processing performance of the meniscus lens.

In an embodiment, referring to FIG. 1, the third lens group LG3 includes at least two aspheric lenses. Since the first lens group LG1 has positive optical power, the second lens group LG2 has positive optical power, the third lens group LG3 has a negative optical power, and the fourth lens group LG4 has positive optical power, this arrangement makes the waist portion of the lithography projection objective be located in the third lens group LG3. The lenses in the third lens group LG3 have a smaller aperture. Therefore, at least two aspheric lenses can be arranged in the third lens group LG3 to reduce the aperture of the aspheric lens, reduce the processing difficulty and detection difficulty of the aspheric lens, thereby reducing the processing cost of the lithography projection objective.

In an embodiment, referring to FIG. 1, in the third lens group LG3, the eighth lens 8 and the tenth lens 10 are aspheric lenses.

In an embodiment, referring to FIG. 1, the lithography projection objective further includes an aperture stop (AS), which is located between two adjacent lenses in the fourth lens group LG4. The fourth lens group LG4 has a positive optical power, and the fourth lens group LG4 includes a lens with the largest aperture in the entire lithography projection objective, and the aperture of the lens refers to the effective aperture. The aperture stop (AS) is located in the fourth lens group LG4, and the distance between the aperture stop (AS) and the lens with the largest diameter is relatively close, which is beneficial to adjust the numerical aperture of the lithography projection objective.

In an embodiment, the lens with the largest aperture in the lithography projection objective is the thirteenth lens 13 in the fourth lens group LG4, and the aperture stop (AS) is located in the fourth lens group LG4, and is located in between the thirteenth lens 13 and the fourteenth lens 14. The aperture stop (AS) is set in the fourth lens group LG4, and the aperture stop (AS) is located between the lens with a largest diameter in the lithography projection objective and the lens adjacent to the lens with the largest diameter in the lithography projection objective. The distance between AS and the lens with the largest aperture is the closest (there is no other lens between the stop AS and the thirteenth lens 13), which improves the convenience of adjusting the numerical aperture of the lithography projection objective. It is understandable that the numerical aperture of the lithography projection objective may be adjusted by the aperture stop (AS). The numerical aperture (NA) of the lithography projection objective in the embodiments of the present application satisfies: $0.5 \leq NA \leq 0.82$.

Figure 2:
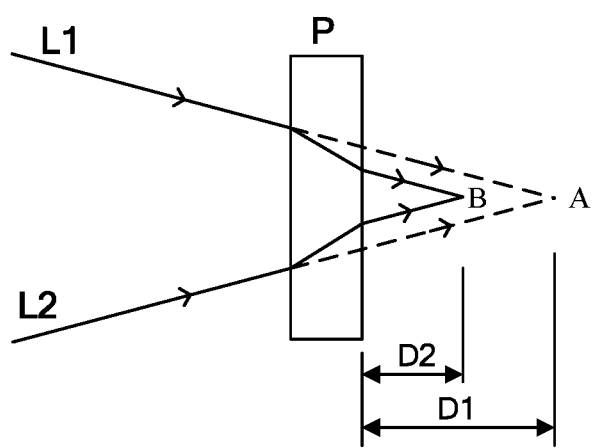
FIG. 2 is a schematic diagram of an optical path of parallel plates according to an embodiment of the present application.

FIG. 2 is a schematic diagram of an optical path of parallel plates according to an embodiment of the present application. Referring to FIGS. 1 and 2, the light incident surface and the light output surface of any lens in the fifth lens group LG5 are both plane. That is to say, the lenses in the fifth lens group LG5 are all parallel plates, for example, plane glass may be used, and the optical power of any lens in the fifth lens group LG5 is 0. The advantage of this design is that the beam diameter at the back end of the lithography projection objective is minimized while the minimum aberration is ensured, so that the size of the components at the back end of the lithography projection objective near the image plane is smaller and more compact.

In an embodiment, referring to FIG. 2, a first light L1 and a second light L2 propagate according to the dashed line in FIG. 2 when the plate glass P is not placed, and cross at point A; the first light L1 and the second light L2 irradiate one side surface of the plate glass P when the plate glass P is placed, and are refracted at one side surface of the plate glass P, and then continue to propagate in the plate glass P, and are refracted at the other side surface of the plate glass P, and then continues to propagate in the air and cross at point B. Due to the refraction of the parallel glass P, the distance between the point A and the plate glass P is D1, and the second distance between the point B and the plate glass P is D2, and $D_1 > D_2$. When the first light L1 and the second light L2 are regarded as the edges of a beam, it is easy to see that the existence of the plate glass P reduces the beam diameter.

In an embodiment, referring to FIG. 1, the first lens group LG1 includes an anamorphic lens compensator, the anamorphic lens compensator is a lens in the first lens group LG1, and a diameter-to-thickness ratio of the anamorphic lens compensator is 9 to 10, that is, the diameter-to-thickness ratio of the anamorphic lens compensator may be any value from 9:1 to 10:1 including endpoint values 9:1 and 10:1. The effective aperture of the first surface of the anamorphic lens compensator is $\phi_1$, and the effective aperture of the second surface of the anamorphic lens compensator is $\phi_2$: the second surface of the anamorphic lens compensator is located between the first surface of the anamorphic lens compensator and the second lens group, and $\phi_2 - \phi_1 > 20$ mm. The first surface of the anamorphic lens compensator may also be referred to as a front surface of the anamorphic lens compensator, and the second surface of the anamorphic lens compensator may also be referred to as a back surface of the anamorphic lens compensator. The anamorphic lens compensator provided by the embodiments of the present application has a large difference in the effective aperture of the first surface and the second surface, and the range of the diameter-to-thickness ratio is 9 to 10, which can compensate the deformation of other lenses in the lithography projection objective during use, so as to ensure the normal use of the lithography projection objective. The diameter-to-thickness ratio is the ratio of the maximum diameter to the thickness of the lens. In an embodiment, if the diameter of the front surface of the lens is smaller than the diameter of the back surface of the lens, the diameter-to-thickness ratio of the lens is the ratio of the diameter of the back surface to the thickness of the lens.

In an embodiment, referring to FIG. 1, the first lens 1 in the first lens group LG is an anamorphic lens compensator.

In an embodiment, referring to FIG. 1, an embodiment of the present application provides a lithography projection objective. The first lens group LG1 includes three lenses, and the first lens group LG1 includes a first lens 1, a second lens 2, and a third lens 3 that are sequentially arranged along the optical axis. The first lens 1 and the third lens 3 are negative lenses with negative optical power, and the second lens 2 is a positive lens with positive optical power. Two lenses among the three lenses of the first lens group LG1 are aspheric lenses, and the first lens 1 and the second lens 2 in the first lens group LG1 are aspheric lenses. The second lens group LG2 includes four lenses. The second lens group LG2 includes a fourth lens 4, a fifth lens a sixth lens 6, and a seventh lens 7, which are sequentially arranged along the optical axis, and the lens in the second lens group LG2 are all positive lenses having positive optical power. There is no aspheric lens in the second lens group LG2. The third lens group LG3 includes three lenses. The third lens group LG3 includes an eighth lens 8, a ninth lens 9, and a tenth lens 10 that are sequentially arranged along the optical axis. The lenses in the third lens group LG3 are all negative lenses with negative optical power. Two lenses among the three lenses of the first lens group LG3 are aspheric lenses, and the eighth lens 8 and the tenth lens 10 are aspheric lenses. The fourth lens group LG4 includes seven lenses. The fourth lens group LG4 includes an eleventh lens 11, a twelfth lens 12, a thirteenth lens 13, a fourteenth lens 14, a fifteenth lens 15, a sixteenth lens 16 and a seventeenth lens 17 that are sequentially arranged along the optical axis. The fourteenth lens 14 is a negative lens with negative optical power, and the other lenses in the fourth lens group LG4 except for the fourteenth lens 14 are positive lenses with positive optical power, three lenses among the seven lenses of the fourth lens group LG4 are aspherical lenses. The eleventh lens 11, the fourteenth lens 14, and the sixteenth lens 16 are aspheric lenses. The fifth lens group LG5 includes two lenses. The fifth lens group LG5 includes an eighteenth lens 18 and a nineteenth lens 19 arranged in sequence along the optical axis. The optical powers of the eighteenth lens 18 and the nineteenth lens 19 are both 0, and the eighteenth lens 18 and the nineteenth lens 19 may be plane glass. The numerical aperture of the lithography projection objective provided by the embodiments of the present application may reach 0.82, the wavelength of the imaging beam may be 248.3271 nm, the wavelength bandwidth is 0.35 pm, the magnification is −¼, the half view field height on the image side is 54.6 mm, and the maximum aperture of the lens is 274 mm, the maximum aspheric lens diameter is 255 mm, the number of aspheric lenses is 7, and the number of lenses is 19. The average deviation of the aspheric surface is 0.21 mm, the maximum deviation of the aspheric surface is 0.46 mm, the image-side telecentricity is 1.1 microradians, the average slope of the aspheric surface is 0.019, the maximum slope of the aspheric surface is 0.034, and the maximum light angle is 50 degrees, wave aberration root mean square (RMS) (average value in the field) is 0.0073, the distortion (average value in the field) is 1.5 nm, the diameter-to-thickness ratio of the anamorphic lens compensator is 9:1, and the maximum effective aperture of the lithography projection objective at the distance of 66 mm (the embodiments of the present application takes 66 mm from the image plane as an example for explanation, in other embodiments, other positions may be selected to compare the effective apertures of different lithography projection objectives.) from the image plane is 127.5 mm. In the related art, the effective aperture of the lithography projection objective at 66 mm from the image plane is usually about 170 mm. The lithography projection objective provided by the embodiments of the present application has a smaller bottom size, thereby leaving more space for the layout of other components. In the actual use scene of the lithography projection objective provided by the embodiments of the present application, the smaller bottom size can leave more space for the focusing and leveling device and other components, so that the lithography projection objective provided by the embodiments of the present application can be applied to a lithography machine including two workpiece tables, compared with the lithography machine including only one workpiece table, the lithography machine including two workpiece tables can realize the lithography on the workpieces on the two workpiece tables, which improves the working efficiency of the lithography machine. In an embodiment, an object-image conjugate distance of the lithography projection objective is less than or equal to 1100 mm. The object-image conjugate distance is a distance between the object plane and the image plane of the lithography projection. In the related art, the object-image conjugate distance of a lithography projection objective is usually about 1250 mm. The lithography projection objective provided by the embodiments of the present application has a smaller object-image conjugate distance, so that the length of the lithography projection objective can be shortened.

resents air. The space in the "refractive index" column represents the refractive index of air. The refractive index of the fused silica material is relative to a refractive index of air.

TABLE 1

A specific design value of a lithography projection objective

| Serial number | Surface type | Radius (mm) | Thickness (mm) | Lens material | Refractive index | Effective aperture (mm) |
|---|---|---|---|---|---|---|
| 1 | Spherical | 1.00E+18 | 46.76525 | | | 123.0473 |
| 2 | Aspherical | −170.2023707 | 14.00012 | 'silica' | 1.508365 | 124.335 |
| 3 | Spherical | 462.5753674 | 11.93106 | | | 141.8513 |
| 4 | Aspherical | 533.67692897 | 18.50009 | 'silica' | 1.508365 | 155.8435 |
| 5 | Spherical | 639.4287324 | 36.89983 | | | 165.7797 |
| 6 | Spherical | −165.461079 | 21.64295 | 'silica' | 1.508365 | 173.2937 |
| 7 | Spherical | −237.115229 | 1.500071 | | | 200.2463 |
| 8 | Spherical | −770.760899 | 46.09236 | 'silica' | 1.508365 | 219.6801 |
| 9 | Spherical | −183.26896 | 1.500245 | | | 230.9577 |
| 10 | Spherical | 829.1605609 | 49.93268 | 'silica' | 1.508365 | 259.4031 |
| 11 | Spherical | −335.566404 | 1.500803 | | | 262.4642 |
| 12 | Spherical | 275.9292543 | 54.01452 | 'silica' | 1.508365 | 258.1786 |
| 13 | Spherical | −898.465164 | 1.5 | | | 253.0839 |
| 14 | Spherical | 171.9305617 | 54.98128 | 'silica' | 1.508365 | 214.9095 |
| 15 | Spherical | 631.1804875 | 11.22908 | | | 189.5265 |
| 16 | Spherical | 892.7780049 | 27.70098 | 'silica' | 1.508365 | 176.4434 |
| 17 | Aspherical | 129.25230852 | 39.79247 | | | 134.6829 |
| 18 | Spherical | −172.490078 | 12 | 'silica' | 1.508365 | 126.6182 |
| 19 | Spherical | 95.1521225 | 99.60759 | | | 115.8916 |
| 20 | Aspherical | −106.1630446 | 13.1073 | 'silica' | 1.508365 | 139.6798 |
| 21 | Spherical | 685.9741349 | 31.7274 | | | 177.1208 |
| 22 | Aspherical | −471.7954709 | 54.99807 | 'silica' | 1.508365 | 203.4622 |
| 23 | Spherical | −151.658061 | 1.500153 | | | 223.6229 |
| 24 | Spherical | −799.908869 | 52.04003 | 'silica' | 1.508365 | 255.9935 |
| 25 | Spherical | −197.688672 | 1.500253 | | | 263.5846 |
| 26 | Spherical | 315.1636329 | 56.99652 | 'silica' | 1.508365 | 273.7473 |
| 27 | Spherical | −732.178257 | 7.334287 | | | 270.5987 |
| 28 | Spherical | 1.00E+18 | 52.15317 | | | 258.9229 |
| 29 | Aspherical | −232.8386822 | 30.20009 | 'silica' | 1.508365 | 254.9386 |
| 30 | Spherical | −313.043226 | 24.44676 | | | 265.7062 |
| 31 | Spherical | 1.00E+18 | 39.36781 | 'silica' | 1.508365 | 263.1963 |
| 32 | Spherical | −330.509544 | 1.500005 | | | 262.8231 |
| 33 | Spherical | 168.6947016 | 46.41459 | 'silica' | 1.508365 | 224.5893 |
| 34 | Aspherical | 599.98617179 | 19.11813 | | | 212.7173 |
| 35 | Spherical | 110.5015568 | 42.03051 | 'silica' | 1.508365 | 158.4378 |
| 36 | Spherical | 536.2452627 | 8.541972 | | | 138.8395 |
| 37 | Spherical | 1.00E+18 | 47.00001 | 'silica' | 1.508365 | 127.2389 |
| 38 | Spherical | 1.00E+18 | 1 | | | 66.22128 |
| 39 | Spherical | 1.00E+18 | 10 | 'silica' | 1.508365 | 63.34244 |
| 40 | Spherical | 1.00E+18 | 8 | | | 50.35997 |
| 41 | Spherical | | | | | 27.32925 |

Table 1 shows a specific design value of the lithography projection objective, and the specific value may be adjusted according to product requirements, and is not a limitation of the embodiments of the present application. The lithography projection objective shown in Table 1 may be as shown in FIG. 1. A lens generally includes two surfaces, and each surface is a refractive surface. The serial numbers in Table 1 are numbered according to the surface of a plurality of lenses. The serial number "1" represents the object plane, the serial number "41" represents the image plane, and the serial number "28" represents the aperture stop. A positive radius value represents that the center of curvature is on a side of a surface close to the image plane, and a negative radius value represents that the center of curvature is on a side of a surface close to the object plane. The value in the "thickness" column represents an on-axis distance from the current surface to the next surface. The refractive index is a refractive index when the center wavelength is 248.3271 nm. The lens material may be a fused silica material, represents as "Silica", and the space in the "lens material" column rep- In the exemplary embodiment of the present application, the aspheric surface may be represented by a Q-type aspheric surface polynomial. The Q-type aspheric polynomial is:

$$z = \frac{c_{hfs}r^2}{1+\sqrt{1-c_{bfs}^2(k+1)r^2}} + \frac{u^2(1-u^2)\sqrt{1-c_{bfs}^2kr^2}}{\sqrt{1-c_{bfs}(k+1)r^2}}\sum_{m=0}^{13}a_m Q_m^{bfs}(u^2),$$

in which, z denotes the axial rise of the surface in the Z direction, $c_{bfs}$ denotes the curvature of the best fitting spherical surface, $r=\sqrt{x^2+y^2}$, r denotes the radial distances on the diagonal lines of x and y, x and y denote the coordinate values of the X direction and the Y direction respectively, the X direction, the Y direction and the Z direction conform to a Cartesian coordinate system, k denotes the cone coefficient of the best fitting cone, u denotes the normalized radial distance, $a_m$ denotes a polynomial coefficient, and $Q_m^{bfs}(u^2)$ denotes an m order orthogonal jacobi polynomial with $a_m$ as the coefficient.

TABLE 2

A specific design value of an aspheric surface in a lithography projection objective

| parameter | Surface 2 | Surface 4 | Surface 17 | Surface 20 |
|---|---|---|---|---|
| r (mm) | −170.2023707397280 | 533.6769289769200 | 129.2523085266040 | −106.1630446065930 |
| μ (mm) | 61.9305327088275 | 77.8842858814968 | 67.2913500864424 | 69.8611236286773 |
| k (mm) | 0.0000000000000 | 0.0000000000000 | 0.0000000000000 | 0.0000000000000 |
| $a_4$ | 0.3279413580179 | −0.7030999691775 | 1.0881918491618 | 0.1761407654610 |
| $a_6$ | −0.4944023641812 | 0.4212193353749 | −0.0550516610573 | 0.3082036960306 |
| $a_8$ | −0.0471362281905 | 0.1724817978136 | 0.0082961205997 | −0.0482360333879 |
| $a_{10}$ | −0.0106579684760 | 0.0290883411141 | −0.0005598537250 | 0.0115371996092 |
| $a_{12}$ | −0.0015467496950 | 0.0050292946305 | −0.0001914738972 | −0.0030290938333 |
| $a_{14}$ | −0.0006714945960 | 0.0016337346838 | 0.0000711867044 | 0.0008551444562 |
| $a_{16}$ | 0.0000522872459 | 0.0005493419382 | 0.0000018615386 | −0.0001561317237 |
| $a_{18}$ | −0.0000895023098 | 0.0000780190668 | −0.0000239335960 | 0.0000251494209 |
| $a_{20}$ | 0.0000239235348 | 0.0000666801251 | 0.0000087867189 | −0.0000485848244 |

| parameter | Surface 22 | Surface 29 | Surface 34 |
|---|---|---|---|
| r (mm) | −471.7954709264600 | −232.8386822469550 | 599.9861717960250 |
| μ (mm) | 101.7554640856910 | 127.6932422881870 | 106.5472819655220 |
| k (mm) | 0.0000000000000 | 0.0000000000000 | 0.0000000000000 |
| $a_4$ | −0.5453980786282 | 1.9116622669042 | 0.7271642936471 |
| $a_6$ | 0.5535733574538 | −0.0571484417611 | 0.1823639066884 |
| $a_8$ | −0.0594325639807 | −0.0103658371110 | 0.0086287565299 |
| $a_{10}$ | −0.0027469000152 | 0.0006338833125 | −0.0002460772349 |
| $a_{12}$ | 0.0013580929672 | 0.0003477547158 | −0.0000868899656 |
| $a_{14}$ | −0.0003812876027 | 0.0000575237454 | 0.0001325262259 |
| $a_{16}$ | −0.0000445977022 | −0.0000105812332 | −0.0000436858181 |
| $a_{18}$ | 0.0000148003938 | 0.0000144524750 | 0.0000571404810 |
| $a_{20}$ | 0.0000302522893 | −0.0000257672738 | −0.0000460837728 |

Table 2 is a specific design value of an aspheric surface in the lithography projection objective, and "surface 2", "surface 4", "surface 17", "surface 20", "surface 22", "surface 29" and "surface 34" in table 2 correspond to the reference numerals "2", "4", "17", "20", "22", "29" and "34" in table 1, respectively. The corresponding parameters in the Q-type aspheric polynomial not given in Table 2 are known in related art. Multiple parameters in the "parameter" column of Table 2 are consistent with the Q-type aspheric polynomial.

Figure 3:
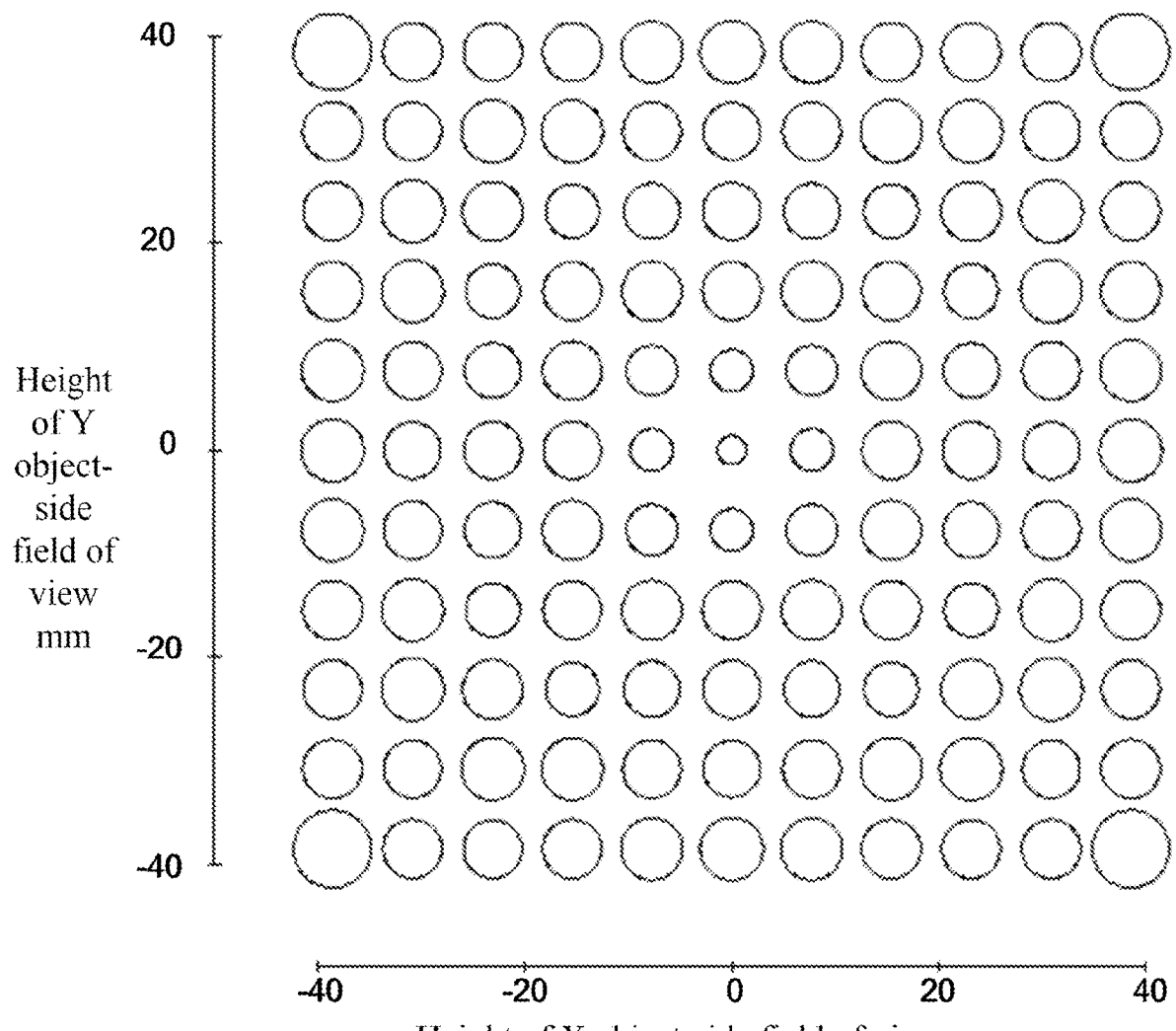
FIG. 3 is a distribution graph of wave aberration in a view field of the lithography projection objective shown in FIG. 1.

FIG. 3 is a distribution graph of wave aberration in a view field of the lithography projection objective shown in FIG. 1; referring to FIG. 1 and FIG. 3, the aberration has been eliminated and the imaging in the view field is good.

Figure 4:
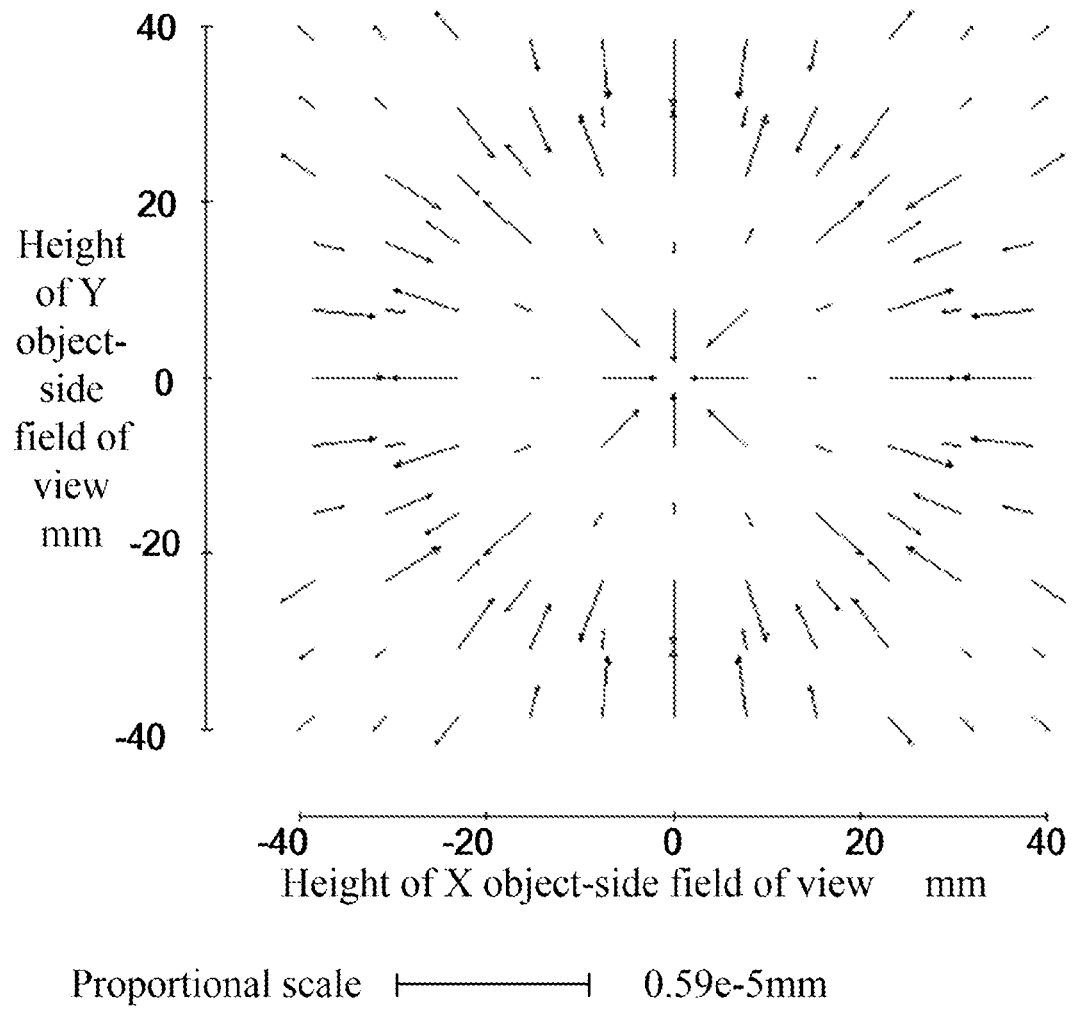
FIG. 4 is a distribution graph of centroid distortion in a view field of the lithography projection objective shown in FIG. 1.

FIG. 4 is a distribution graph of centroid distortion in a view field of the lithography projection objective shown in FIG. 1; referring to FIGS. 1 and 4, a distortion has been eliminated and the imaging in the view field is good. An abscissa of FIGS. 3 and 4 is a height of the X object-side view field, which represents a height of the object-side view field in the X direction, a unit of the abscissa is mm, and an ordinate of FIGS. 3 and 4 is a height of the Y object-side view field, which represents a height of the object-side view field in the Y direction, a unit of the ordinate is mm.

Embodiment 2

Figure 5:
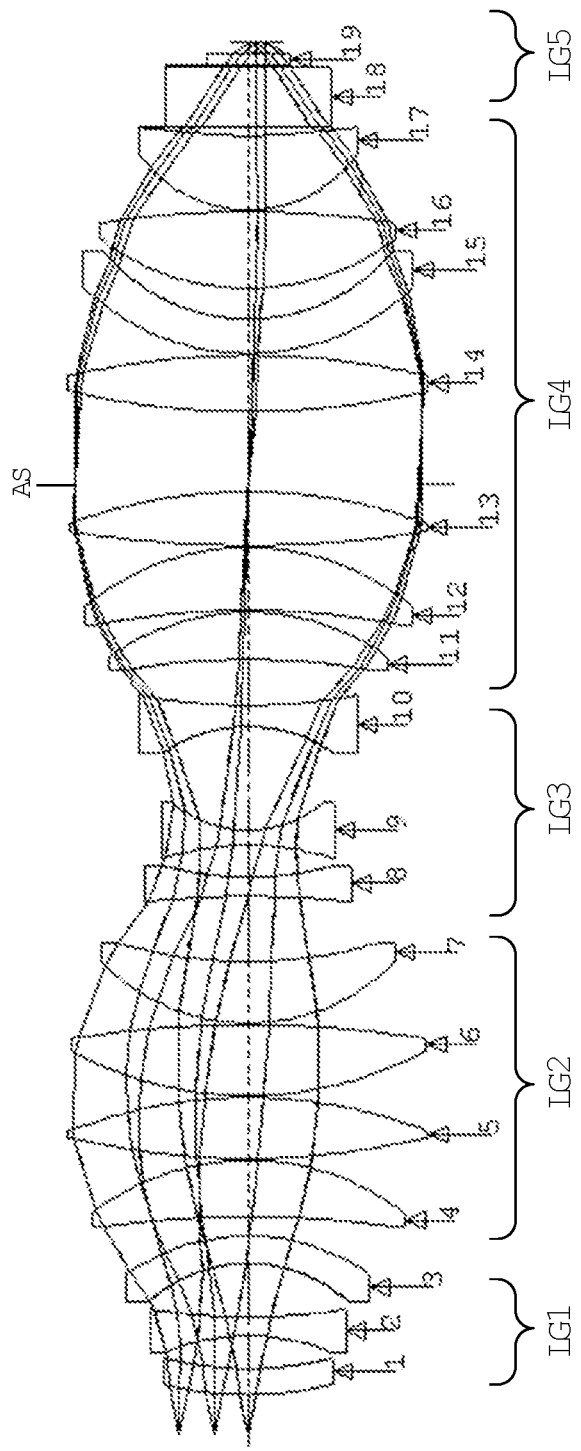
FIG. 5 is a schematic diagram of a lithography projection objective according to another embodiment of the present application.

FIG. 5 is a schematic diagram of a lithography projection objective according to another embodiment of the present application. The similarities in the second embodiment and the first embodiment will not be repeated herein. The reference numerals in FIG. 5 are the same as those in FIG. 1, and the similarities will not be repeated herein. Referring to FIG. 5, the first lens group LG1 includes three lenses, and the first lens group LG1 includes a first lens 1, a second lens 2, and a third lens 3 arranged in sequence along the optical axis. The first lens 1, the second lens 2, and the third lens 3 are all negative lenses with negative optical power. Two lenses among the three lenses of the first lens group LG1 are aspheric lenses, and the first lens 1 and the third lens 3 in the first lens group LG1 are aspheric lenses. The second lens group LG2 includes four lenses. The third lens group LG3 includes three lenses, two lenses among the three lenses of the third lens group LG3 are aspherical lenses. The fourth lens group LG4 includes seven lenses. The fourth lens group LG4 includes an eleventh lens 11, a twelfth lens 12, a thirteenth lens 13, a fourteenth lens 14, a fifteenth lens 15, a sixteenth lens 16 and a seventeenth lens 17 that are sequentially arranged along the optical axis. The fifteenth lens 15 is a negative lens with negative optical power, and the other lenses in the fourth lens group LG4 except for the fifteenth lens 15 are positive lenses with positive optical power, four lenses among the seven lenses of the fourth lens group LG4 are aspherical lenses. The eleventh lens 11, the twelfth lens 12, the fifteenth lens 15 and the seventeenth lens 17 are aspheric lenses. The fifth lens group LG5 includes two lenses. The numerical aperture of the lithography projection objective provided by the embodiments of the present application may reach 0.82, the wavelength of the imaging beam may be 248.3271 nm, the wavelength bandwidth is 0.35 pm, the magnification is −¼, the half view field height on the image side is 54.4 mm, and the maximum aperture of the lens is 281 mm, the maximum aspheric lens diameter is 237 mm, the number of aspheric lenses is 8, and the number of lenses is 19. The average deviation of the aspheric surface is 0.29 mm, the maximum deviation of the aspheric surface is 0.44 mm, the image-side telecentricity is 1.1 microradians, the average slope of the aspheric surface is 0.03, the maximum slope of the aspheric surface is 0.045, and the maximum light angle is 51.2 degrees, wave aberration RMS (average value in the field) is 0.0045, the distortion (average value in the field) is 1.6 nm, the diameter-to-thickness ratio of the anamorphic lens compensator is 9:1, and the maximum effective aperture of the lithography projection objective at the distance of 66 mm from the image plane is 128.9 mm.

TABLE 3

Another specific design value of a lithography projection objective

| Serial number | Surface type | Radius (mm) | Thickness (mm) | Lens material | Refractive index | Effective aperture (mm) |
|---|---|---|---|---|---|---|
| 1 | Spherical | 1.00E+18 | 32 | 'A_22_N2' | 0.999996 | |
| 2 | Spherical | 266.381154 | 20.529199 | 'FS_22_N2' | 1.50841 | 125.8433 |
| 3 | Aspherical | 232.807707 | 25.924571 | | | 128.1058 |
| 4 | Spherical | −181.34969 | 15.0013 | 'FS_22_N2' | 1.50841 | 130.6239 |
| 5 | Spherical | 485.467865 | 42.226402 | | | 148.2466 |
| 6 | Aspherical | −117.47709 | 21.966409 | 'FS_22_N2' | 1.50841 | 156.0894 |
| 7 | Spherical | −167.7531 | 15.007844 | | | 185.7334 |
| 8 | Spherical | −829.81125 | 44.635653 | 'FS_22_N2' | 1.50841 | 229.4134 |
| 9 | Spherical | −202.65908 | 1.5 | | | 240.7356 |
| 10 | Spherical | 609.828021 | 48.089882 | 'FS_22_N2' | 1.50841 | 275.0283 |
| 11 | Spherical | −388.07468 | 1.5 | | | 276.5353 |
| 12 | Spherical | 295.016137 | 55.820695 | 'FS_22_N2' | 1.50841 | 273.2381 |
| 13 | Spherical | −914.15655 | 1.5 | | | 268.5769 |
| 14 | Spherical | 162.152884 | 48.594884 | 'FS_22_N2' | 1.50841 | 224.7073 |
| 15 | Spherical | 363.537102 | 51.453881 | | | 204.6525 |
| 16 | Spherical | −800 | 15 | 'FS_22_N2' | 1.50841 | 157.4007 |
| 17 | Aspherical | 222.858216 | 25.60415 | | | 136.435 |
| 18 | Spherical | −215.53419 | 11.88 | 'FS_22_N2' | 1.50841 | 131.0916 |
| 19 | Spherical | 92.5254938 | 81.486844 | | | 118.1158 |
| 20 | Aspherical | −136.1465 | 17.000398 | 'FS_22_N2' | 1.50841 | 134.3327 |
| 21 | Spherical | 458.406218 | 36.222087 | | | 167.3559 |
| 22 | Aspherical | −595.09415 | 37.402143 | 'FS_22_N2' | 1.50841 | 199.4458 |
| 23 | Spherical | −188.97 | 1.500001 | | | 214.1304 |
| 24 | Aspherical | −605.86228 | 49.654388 | 'FS_22_N2' | 1.50841 | 237.7957 |
| 25 | Spherical | −201.29284 | 1.5 | | | 250.9426 |
| 26 | Spherical | 900 | 42.543443 | 'FS_22_N2' | 1.50841 | 274.4699 |
| 27 | Spherical | −408.71983 | 6 | | | 275.8082 |
| 28 | Spherical | 1.00E+18 | 57.240056 | | | 272.4467 |
| 29 | Spherical | 622.303858 | 44.497129 | 'FS_22_N2' | 1.50841 | 281.5531 |
| 30 | Spherical | −634.00157 | 1.5 | | | 280.6078 |
| 31 | Spherical | 188.318079 | 27 | 'FS_22_N2' | 1.50841 | 256.5574 |
| 32 | Aspherical | 147.280632 | 24.504095 | | | 230.6474 |
| 33 | Spherical | 193.247126 | 60.419862 | 'FS_22_N2' | 1.50841 | 230.0376 |
| 34 | Spherical | −783.04636 | 1.5 | | | 222.3536 |
| 35 | Spherical | 106.283129 | 58.665905 | 'FS_22_N2' | 1.50841 | 168.452 |
| 36 | Aspherical | 394.856286 | 7.1287776 | | | 135.9883 |
| 37 | Spherical | 1.00E+18 | 47 | 'FS_22_N2' | 1.50841 | 128.9793 |
| 38 | Spherical | 1.00E+18 | 1 | | | 67.09581 |
| 39 | Spherical | 1.00E+18 | 10 | 'FS_22_N2' | 1.50841 | 64.12614 |
| 40 | Spherical | 1.00E+18 | 8 | 'A_22_N2' | 0.999996 | 50.95944 |
| 41 | Spherical | 1.00E+18 | −2.77E−05 | 'A_22_N2' | 0.999996 | 27.20298 |

Table 3 shows another specific design value of a lithography projection objective, and the specific value may be adjusted according to product requirements, and is not a limitation of the embodiments of the present application. The lithography projection objective shown in Table 3 may be as shown in FIG. 5. A lens generally includes two surfaces, and each surface is a refractive surface. The serial numbers in Table 3 are numbered according to the surface of a plurality of lenses. The serial number "1" represents the object plane, the serial number "41" represents the image plane, and the serial number "27" represents the aperture stop. A positive radius value represents that the center of curvature is on a side of a surface close to the image plane, and a negative radius value represents that the center of curvature is on a side of a surface close to the object plane. The value in the "thickness" column represents an on-axis distance from the current surface to the next surface. The refractive index is a refractive index when the center wavelength is 248.3271 nm. The lens material may be a fused silica material, represents as "FS_22_N2", and the space in the "lens material" column represents nitrogen. "A_22_N2" in the "Lens Material" column means air. The space in the "refractive index" column represents the refractive index of nitrogen. The refractive index of the fused silica material is relative to a refractive index of nitrogen. Since the refractive index of the fused silica material in the embodiment two is relative to a refractive index of nitrogen, and the refractive index of the fused silica material in the embodiment one is relative to a refractive index of air, in order to distinguish, in the second embodiment, a different mark from that in the first embodiment is used.

In the exemplary embodiment of the present application, the aspheric surface may be represented by a common aspheric surface polynomial, specifically:

$$z = \frac{cr^2}{1+\sqrt{1-(1+k)c^2r^2}} + Ar^4 + Br^6 + Cr^8 + Dr^{10} + Er^{12} + Fr^{14} + Gr^{16} + Hr^{18} + Jr^{20},$$

in which, z denotes the axial rise of the surface in the Z direction, $r=\sqrt{x^2+y^2}$, r denotes the radial distances on the diagonal lines of x and y, x and y denote the coordinate values of the X direction and the Y direction respectively, the X direction, the Y direction and the Z direction conform to a Cartesian coordinate system, k denotes the cone coefficient of the best fitting cone, c denotes the curvature of the best fitting spherical surface, A, B, C, D, E, F, G, H, J denote all aspheric coefficients.

view field, which represents a height of the object-side view field in the Y direction, the unit of the ordinate is mm.

Embodiment 3

Figure 8:
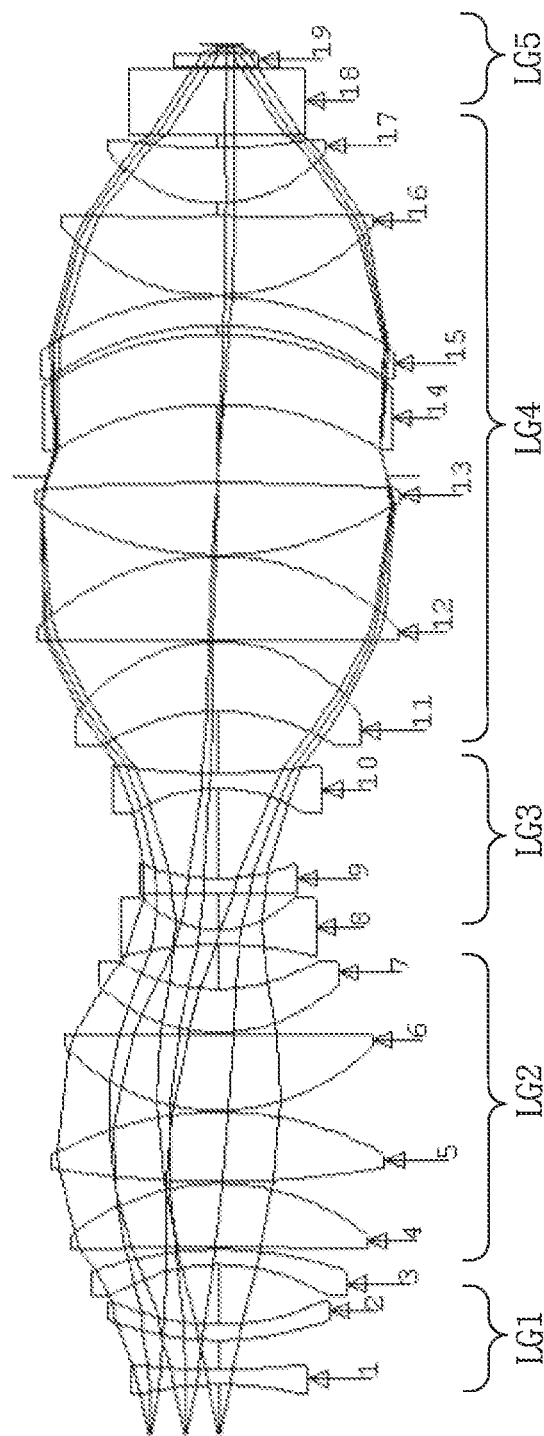
FIG. 8 is a schematic diagram of a lithography projection objective according to another embodiment of the present application.

FIG. 8 is a schematic diagram of a lithography projection objective according to another embodiment of the present application. The similarities between the embodiment three and the embodiment one will not be repeated herein. The reference numerals in FIG. 8 are same as those in FIG. 1, and the similarities will not be repeated herein.

The numerical aperture of the lithography projection objective provided by the embodiments of the present application may reach 0.82, the wavelength of the imaging beam may be 248.3271 nm, the wavelength bandwidth is 0.35 pm, the magnification is −¼, the half view field height on the image side is 54.6 mm, and the maximum aperture of the lens is 272 mm, the maximum aspheric lens diameter is 227 mm, the number of aspheric lenses is 4, and the number of lenses is 19. The average deviation of the aspheric surface is 0.43 mm, the maximum deviation of the aspheric surface is 0.59 mm, the wave aberration RMS (average value in the field) is 0.0167 wavelengths, and the distortion (average value in the field) is 0.3 nm. The maximum effective aperture of the lithography projection objective at the position 66 mm away from the image plane is 126.9 mm.

TABLE 4

Another specific design value of an aspheric surface in a lithography projection objective

| parameter | Surface 2 | Surface 5 | Surface 16 | Surface 19 |
|---|---|---|---|---|
| r (mm) | 232.8077072 | −117.47709 | 222.8582161 | −136.1464964 |
| k (mm) | 0 | 0 | 0 | 0 |
| A | −1.08491767946E−07 | −2.79935514032E−09 | −3.85879867613E−08 | −1.82475495842E−07 |
| B | 7.76129514924E−12 | 3.49934932994E−13 | −3.16754544970E−12 | 4.13848477991E−12 |
| C | 2.74817736331E−16 | −9.73682631867E−17 | −5.13363003835E−16 | −3.96250615343E−16 |
| D | −1.99681774282E−19 | 1.16214722161E−19 | 1.35918857339E−19 | 5.06315974054E−19 |
| E | 1.29319934709E−22 | −4.01951073473E−23 | −4.37252935719E−23 | −2.13779368877E−22 |
| F | −3.80505804659E−26 | 9.56907438310E−27 | 8.65579402940E−27 | 5.93642291071E−26 |
| G | 6.07912227124E−30 | −1.17122853447E−30 | −8.56377996472E−31 | −8.48364436704E−30 |
| H | −3.85716717083E−34 | 6.75110180701E−35 | 3.84331079423E−35 | 5.72906634346E−34 |
| J | 0 | 0 | 0 | 0 |

| parameter | Surface 21 | Surface 23 | Surface 31 | Surface 35 |
|---|---|---|---|---|
| r (mm) | −595.0941514 | −605.8622797 | 147.280632 | 394.8562861 |
| k (mm) | 0 | 0 | 0 | 0 |
| A | 1.12051774983E−08 | 5.75002054970E−10 | −4.17324425330E−09 | −4.41042487353E−08 |
| B | −3.24863513052E−12 | 6.04169548234E−13 | 1.73357752739E−13 | −6.13704511965E−13 |
| C | 1.58130754143E−16 | −2.74724647741E−17 | 8.34072132303E−18 | −5.27626826548E−16 |
| D | −5.07526715175E−21 | 1.15937901481E−21 | 1.72578795217E−22 | 5.74724994995E−20 |
| E | 1.76269172892E−24 | −2.92847885429E−25 | 1.22508471967E−26 | 3.01254565117E−24 |
| F | −2.41617415080E−28 | 2.51899132022E−29 | −2.20389458689E−31 | −1.78010591382E−27 |
| G | 1.57323235045E−32 | −9.94256063404E−34 | 2.33650672275E−35 | 2.99315175591E−31 |
| H | −4.01369800213E−37 | 1.49818255438E−38 | −5.13156339642E−41 | −1.89579449785E−35 |
| J | 0 | 0 | 0 | 0 |

Table 4 is another specific design value of an aspheric surface in a lithography projection objective, and "surface 2", "surface 5", "surface 16", "surface 19", "surface 21", "surface 23", "surface 31" and "surface 35" in table 4 correspond to the reference numerals "2", "5", "16", "19", "21", "23", "31" and "35" in table 3, respectively.

Figure 6:
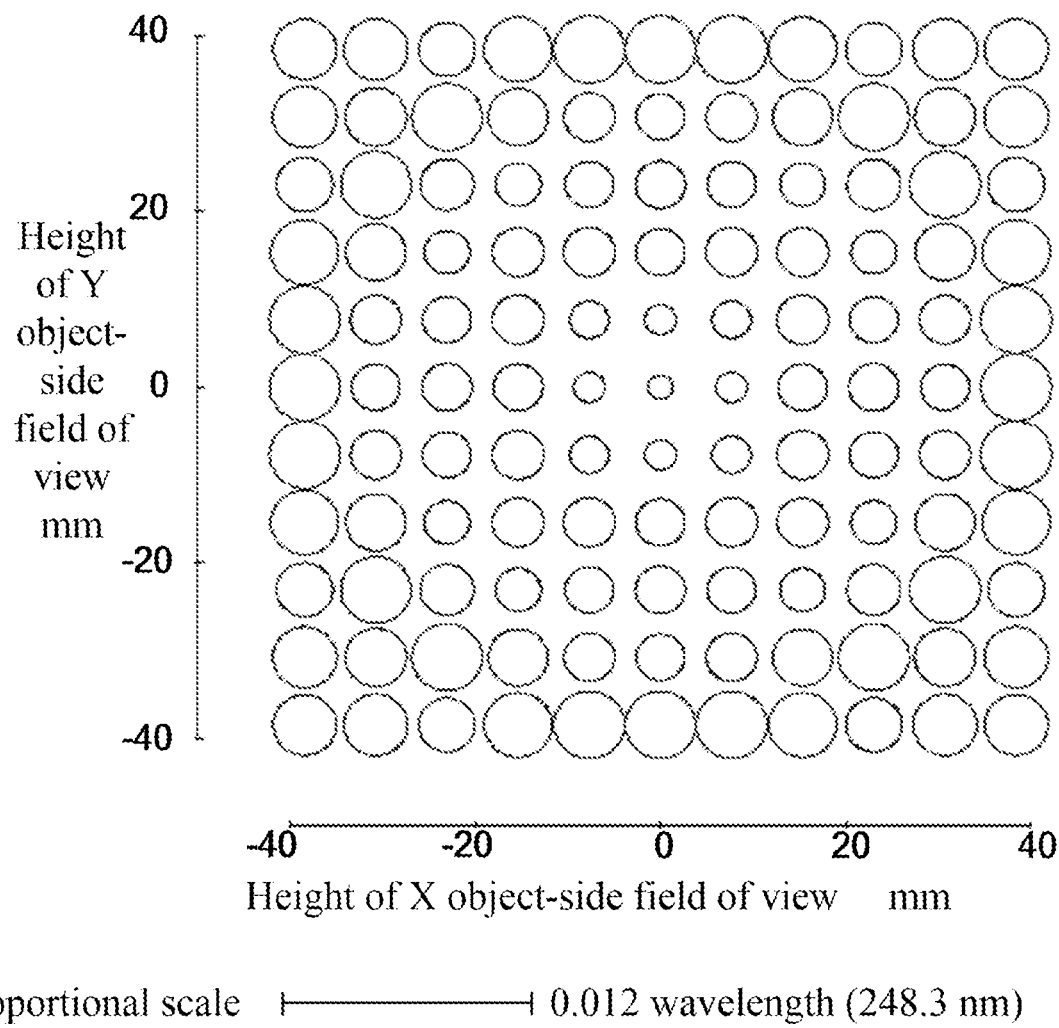
FIG. 6 is a distribution graph of wave aberration in a view field of the lithography projection objective shown in FIG. 5.

FIG. 6 is a distribution graph of wave aberration in a view field of the lithography projection objective shown in FIG. 5; referring to FIG. 5 and FIG. 6, the aberration has been eliminated and the imaging in the view field is good.

Figure 7:
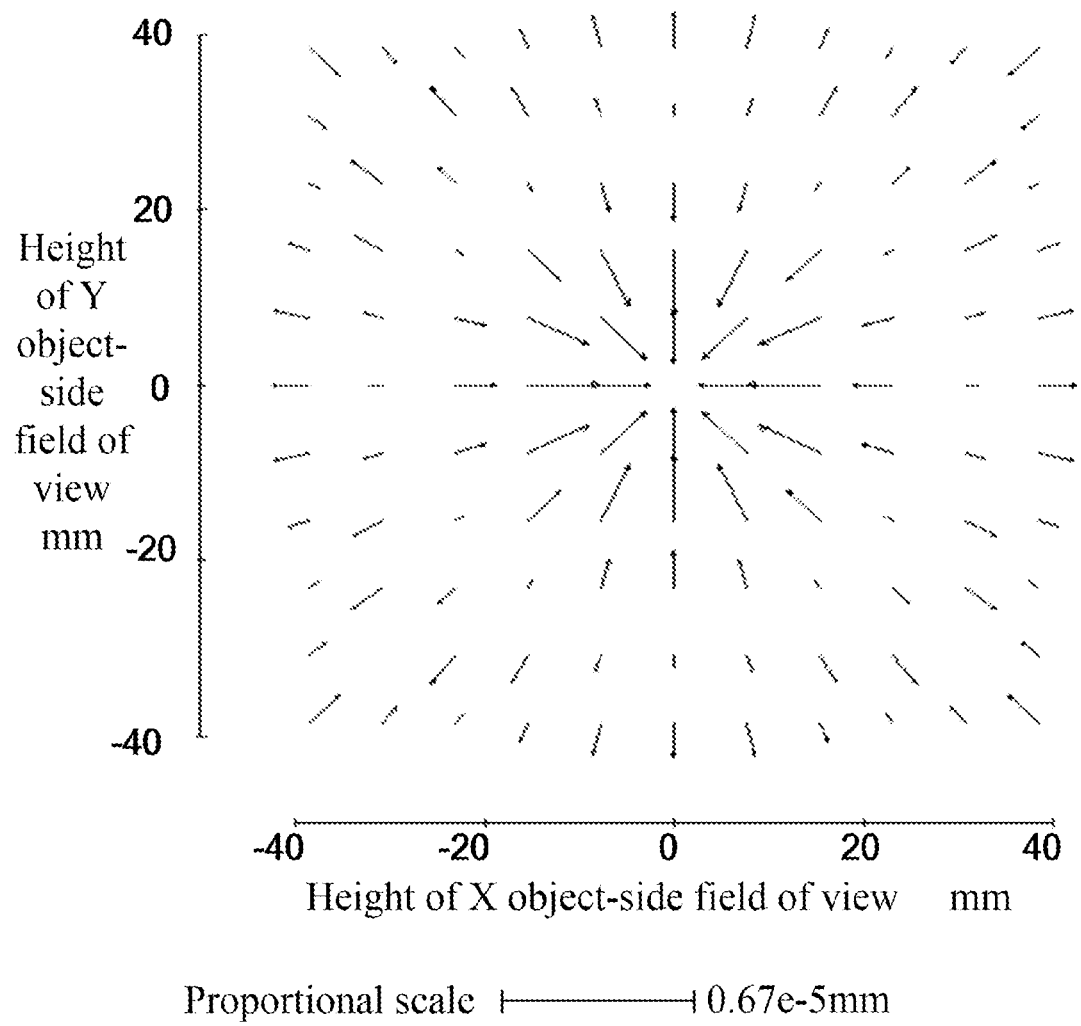
FIG. 7 is a distribution graph of centroid distortion in a view field of the lithography projection objective shown in FIG. 5.

FIG. 7 is a distribution graph of centroid distortion in a view field of the lithography projection objective shown in FIG. 5; referring to FIGS. 5 and 7, the distortion has been eliminated and the imaging in the view field is good. An abscissa of FIGS. 6 and 7 is a height of the X object-side view field, which represents a height of the object-side view field in the X direction, a unit of the abscissa is mm, and an ordinate of FIGS. 6 and 7 is a height of the Y object-side

TABLE 5

Another specific design value of a lithography projection objective

| Serial number | Surface type | Radius (mm) | Thickness (mm) | Lens material | Refractive index | Effective aperture (mm) |
|---|---|---|---|---|---|---|
| 1 | Spherical | 1.00E+18 | 42.08895876 | | | 124.4759 |
| 2 | Aspherical | −276.758358 | 11.9999731 | 'silica' | 1.508365 | 124.4759 |
| 3 | Spherical | 599.6961464 | 23.17512435 | | | 134.9904 |
| 4 | Spherical | 249.004239 | 12 | 'silica' | 1.508365 | 164.0429 |
| 5 | Aspherical | 178.780217 | 47.39103084 | | | 168.5336 |
| 6 | Spherical | −163.919055 | 12.00000244 | 'silica' | 1.508365 | 172.6155 |

TABLE 5-continued

Another specific design value of a lithography projection objective

| Serial number | Surface type | Radius (mm) | Thickness (mm) | Lens material | Refractive index | Effective aperture (mm) |
|---|---|---|---|---|---|---|
| 7 | Spherical | −303.812079 | 1.500004884 | | | 194.9912 |
| 8 | Spherical | −11807.9952 | 50.37914164 | 'silica' | 1.508365 | 217.814 |
| 9 | Spherical | −190.827367 | 1.499955523 | | | 228.2333 |
| 10 | Spherical | 769.0115496 | 55.18195975 | 'silica' | 1.508365 | 252.9516 |
| 11 | Spherical | −273.366598 | 1.5 | | | 255.5894 |
| 12 | Spherical | 173.2562457 | 59.80796806 | 'silica' | 1.508365 | 236.8844 |
| 13 | Spherical | 1.00E+18 | 1.5 | | | 227.4599 |
| 14 | Spherical | 136.0571491 | 34.27479098 | 'silica' | 1.508365 | 183.1805 |
| 15 | Spherical | 151.7823592 | 34.85338373 | | | 155.1668 |
| 16 | Spherical | −324.793983 | 12 | 'silica' | 1.508365 | 147.6262 |
| 17 | Spherical | 85.10063044 | 28.48257301 | | | 119.4583 |
| 18 | Spherical | 1.00E+18 | 12 | 'silica' | 1.508365 | 119.3179 |
| 19 | Spherical | 165.5265432 | 70.59585872 | | | 118.7823 |
| 20 | Aspherical | −126.563364 | 12.29547312 | 'silica' | 1.508365 | 133.9448 |
| 21 | Spherical | 522.5858522 | 48.77213224 | | | 159.3314 |
| 22 | Spherical | −168.996449 | 55 | 'silica' | 1.508365 | 182.0353 |
| 23 | Spherical | −136.973977 | 1.499996702 | | | 218.9152 |
| 24 | Spherical | 42621.17815 | 65.56410251 | 'silica' | 1.508365 | 269.4149 |
| 25 | Spherical | −208.993877 | 1.5 | | | 276.7058 |
| 26 | Spherical | 267.6320904 | 56.84813084 | 'silica' | 1.508365 | 279.2 |
| 27 | Spherical | −2071.53727 | 5.442192093 | | | 274.6821 |
| 28 | Spherical | 1.00E+18 | 56.34166953 | | | 268.0112 |
| 29 | Spherical | 248.499761 | 55.000011 | 'silica' | 1.508365 | 258.7746 |
| 30 | Spherical | 253.499772 | 6.998901414 | | | 267.6424 |
| 31 | Spherical | 235.294982 | 22.60944413 | 'silica' | 1.508365 | 266.0106 |
| 32 | Spherical | 251.221644 | 1.5 | | | 271.05 |
| 33 | Spherical | 166.0040712 | 62.2766129 | 'silica' | 1.508365 | 238.7084 |
| 34 | Aspherical | 4800.022932 | 10.85011958 | | | 227.6473 |
| 35 | Spherical | 113.0621493 | 42.7056062 | 'silica' | 1.508365 | 166.4244 |
| 36 | Spherical | 393.7913148 | 10.81387202 | | | 145.8775 |
| 37 | Spherical | 1.00E+18 | 52.75181128 | 'silica' | 1.508365 | 134.4145 |
| 38 | Spherical | 1.00E+18 | 1 | | | 66.07423 |
| 39 | Spherical | 1.00E+18 | 10 | 'silica' | 1.508365 | 63.20849 |
| 40 | Spherical | 1.00E+18 | 8 | | | 50.25344 |

Table 5 shows another specific design value of a lithography projection objective, and the specific value may be adjusted according to product requirements, and is not a limitation of the embodiments of the present application. The lithography projection objective shown in Table 5 may be as shown in FIG. 8. A lens generally includes two surfaces, and each surface is a refractive surface. The serial numbers in Table 5 are numbered according to the surface of a plurality of lenses. The serial number "1" represents the object plane, the serial number "40" represents the image plane, and the serial number "28" represents the aperture stop. A positive radius value represents that the center of curvature is on a side of a surface close to the image plane, and a negative radius value represents that the center of curvature is on a side of a surface close to the object plane. The value in the "thickness" column represents an on-axis distance from the current surface to the next surface. The refractive index is a refractive index when the center wavelength is 248.3271 nm. The lens material may be a fused silica material, represents as "Silica", and the space in the "lens material" column represents air. The space in the "refractive index" column represents the refractive index of air. The refractive index of the fused silica material is relative to a refractive index of air.

In the embodiment three, the aspheric surface is represented by Q-type aspheric polynomial. The similarity of representation and definition of aspheric surface polynomial in the first embodiment will not be described in detail herein, and it is described in detail in the first embodiment about the representation and definition of aspheric surface polynomial of aspheric surface Q-type.

TABLE 6

Another specific design value of an aspheric surface in a lithography projection objective

| parameter | Surface 2 | Surface 5 | Surface 20 | Surface 34 |
|---|---|---|---|---|
| r (mm) | −276.75835791092 | 178.78021706896 | −126.56336395051 | 4800.02293175106 |
| $u_{(mm)}$ | 62.23490452247 | 84.26655857727 | 66.97238200497 | 113.81485525045 |
| $k_{(mm)}$ | 0.00000000000 | −2.03887889669 | 0.00000000000 | 0.00000000000 |
| $a_4$ | 0.55930494662 | 0.00894519507 | 1.62494933990 | −2.39873017033 |
| $a_6$ | −0.26499342073 | −0.10784349750 | 0.39270462413 | 0.02978127977 |
| $a_8$ | −0.00359803566 | −0.07227358269 | −0.08932782747 | 0.02517659058 |
| $a_{10}$ | −0.00332051709 | −0.01549755627 | 0.01490173599 | 0.00307867917 |
| $a_{12}$ | 0.00016763480 | −0.00214021092 | −0.00196880428 | 0.00033211168 |
| $a_{14}$ | −0.00015795519 | −0.00041939787 | 0.00021511955 | −0.00002088648 |

TABLE 6-continued

Another specific design value of an aspheric surface in a lithography projection objective

| parameter | Surface 2 | Surface 5 | Surface 20 | Surface 34 |
|---|---|---|---|---|
| $a_{16}$ | 0.00007016103 | 0.00000406969 | −0.00001757993 | 0.00002405793 |
| $a_{18}$ | −0.00003290196 | −0.00002177884 | 0.00000195101 | −0.00002071129 |
| $a_{20}$ | 0.00000897852 | 0.00000183281 | −0.00000588447 | 0.00000818475 |

Table 6 is a specific design value of an aspheric surface in a lithography projection objective, and "surface 2", "surface 5", "surface 20" and "surface 34" in table 6 correspond to the reference numerals "2", "5", "20" and "34" in table 5, respectively. The corresponding parameters in the Q-type aspheric polynomial not given in Table 6 are known in the art. Multiple parameters in the "parameter" column of Table 6 are consistent with the Q-type aspheric polynomial.

Figure 9:
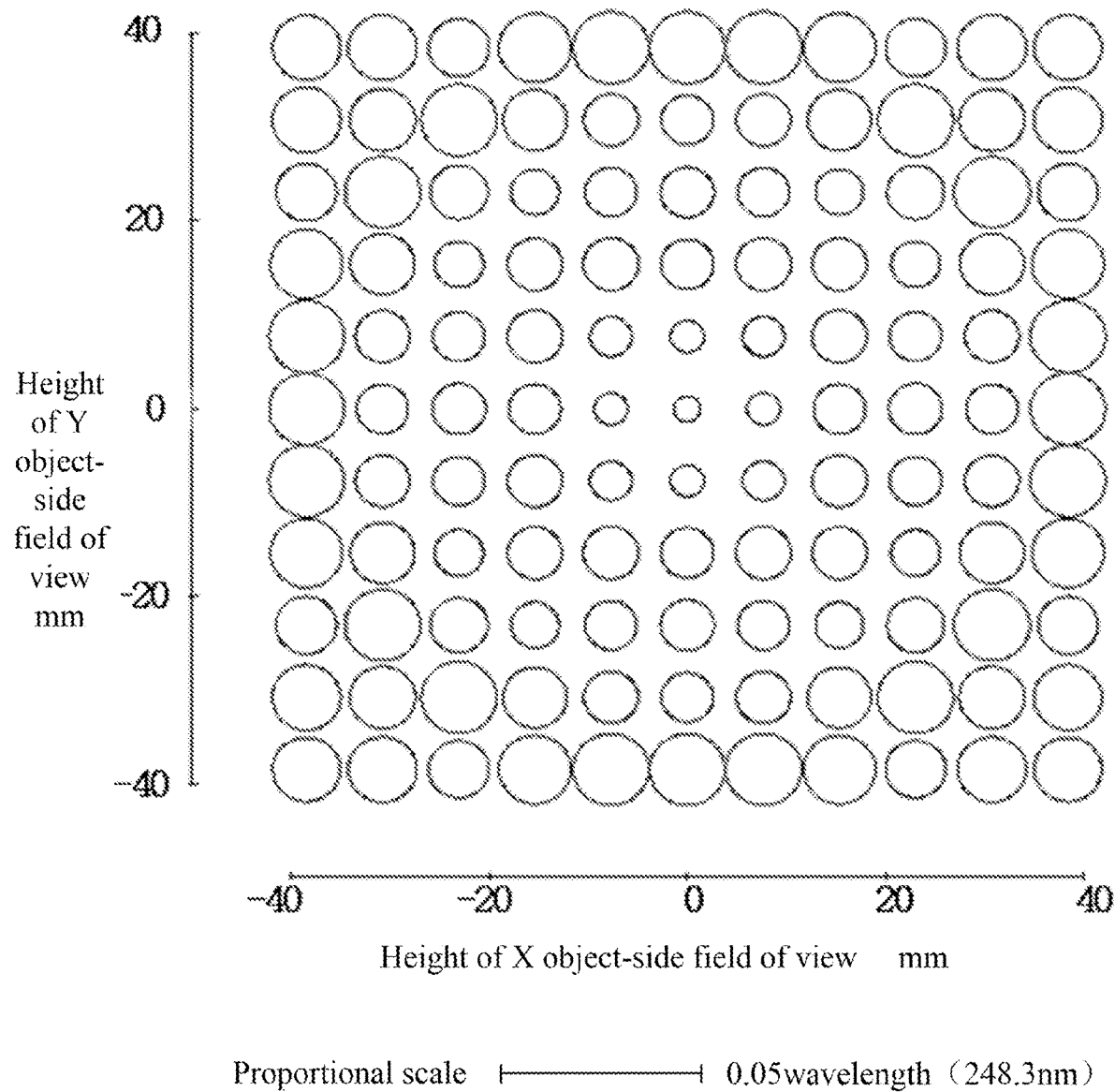
FIG. 9 is a distribution graph of wave aberration in a view field of the lithography projection objective shown in FIG. 8.

FIG. 9 is a distribution graph of wave aberration in a view field of the lithography projection objective shown in FIG. 8; referring to FIG. 8 and FIG. 9, the aberration has been eliminated and the imaging in the view field is good.

Figure 10:
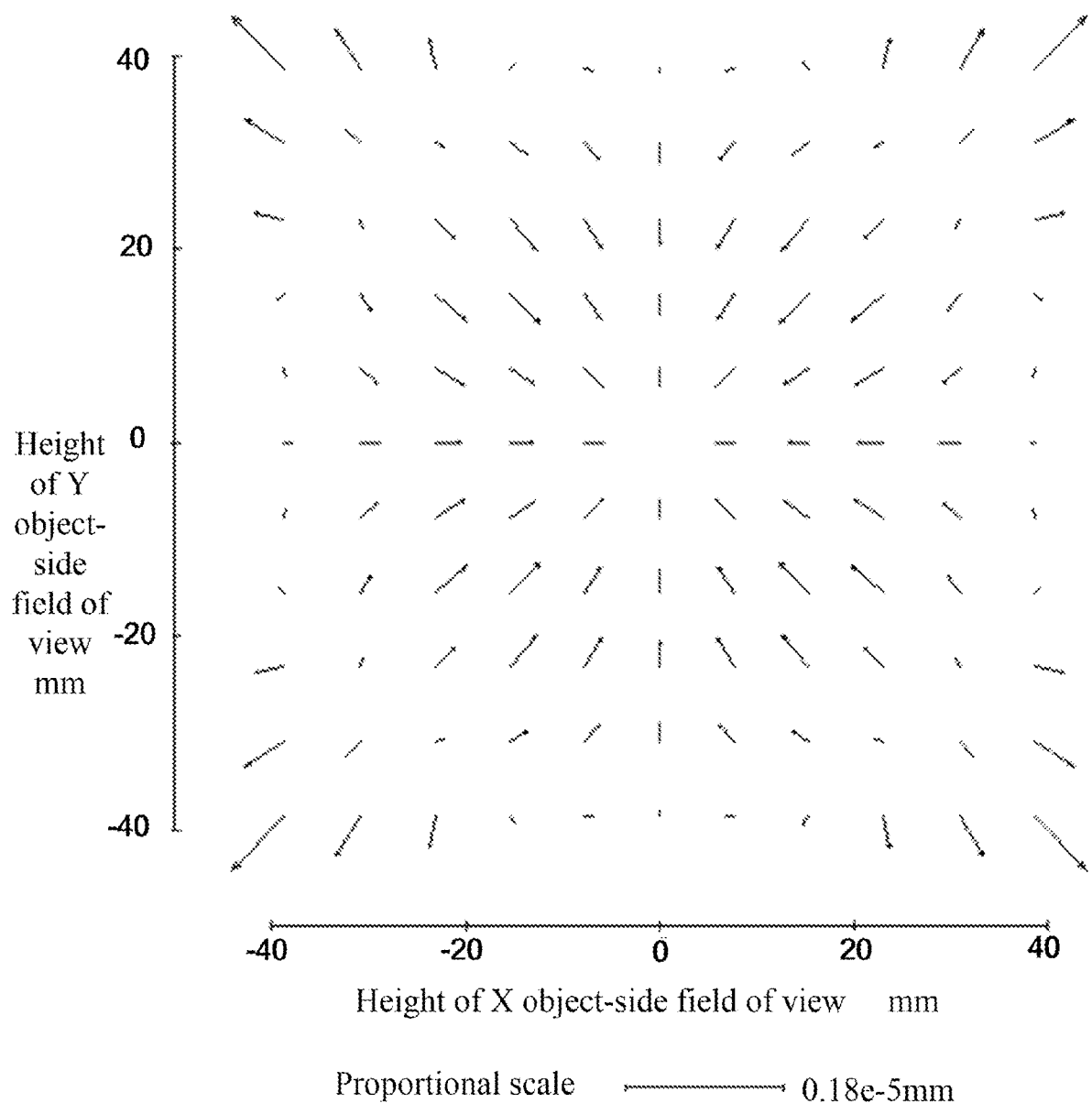
FIG. 10 is a distribution graph of centroid distortion in a view field of the lithography projection objective shown in FIG. 8.

FIG. 10 is a distribution graph of centroid distortion in a view field of the lithography projection objective shown in FIG. 8; referring to FIGS. 8 and 10, the distortion has been eliminated and the imaging in the view field is good. An abscissa of FIGS. 9 and 10 is a height of the X object-side view field, which represents a height of the object-side view field in the X direction, the unit of the abscissa is mm, and an ordinate of FIGS. 3 and 4 is the height of the Y object-side view field, which represents a height of the object-side view field in the Y direction, the unit of the ordinate is mm.

What is claimed is:

1. A lithography projection objective, comprising: a first lens group, a second lens group, a third lens group, a fourth lens group, and a fifth lens group, wherein the first lens group, the second lens group, the third lens group, the fourth lens group, and the fifth lens group are sequentially arranged along an optical axis; the first lens group and the third lens group each has a negative optical power, the second lens group and the fourth lens group each has a positive optical power, the fifth lens group has an optical power of 0, a sum optical power of the first lens group, the second lens group, the third lens group, the fourth lens group, and the fifth lens group is 0; the lithography projection objective further comprises an aperture stop; and the first lens group, the third lens group, and the fourth lens group each comprises aspheric lenses, one aspheric lens of the aspheric lenses comprises an aspherical surface, and a number of the aspheric lenses is greater than or equal to 4 and less than or equal to 8.

2. The lithography projection objective of claim 1, wherein, an aspheric deviation degree of each the aspheric lenses in the first lens group and the third lens group is less than 0.5 mm; and an aspheric deviation degree of at least one aspheric lens in the fourth lens group is greater than or equal to 0.5 mm; or, an aspheric deviation degree of each the aspheric lenses in the first lens group and the fourth lens group is less than 0.5 mm, and an aspheric deviation degree of at least one aspheric lens in the third lens group is greater than or equal to 0.5 mm;

wherein an aspheric deviation degree of an aspheric lens is an axial distance between an aspheric surface of the aspheric lens and a best-fitting spherical surface.

3. The lithography projection objective of claim 1, wherein at least one lens in the fourth lens group has a negative optical power.

4. The lithography projection objective of claim 1, wherein at least one lens in the first lens group has a positive optical power.

5. The lithography projection objective of claim 4, wherein the second lens group comprises a plurality of lenses each having a positive optical power; an optical power value of the lenses having a positive optical power in the first lens group is smaller than an optical power value of any lens in the second lens group.

6. The lithography projection objective of claim 1, wherein the first lens group and the third lens group each comprises a meniscus lens.

7. The lithography projection objective of claim 6, wherein the first lens group and the fourth lens group comprise at least two meniscus lenses in total.

8. The lithography projection objective of claim 1, wherein the third lens group comprises at least two aspherical lenses.

9. The lithography projection objective of claim 1, wherein the aperture stop is located between two adjacent lenses in the fourth lens group.

10. The lithography projection objective of claim 1, wherein:

the first lens group comprises three lenses, and two lenses among the three lenses of the first lens group are aspherical lenses;

the second lens group comprises four lenses;

the third lens group comprises three lenses, and two lenses among the three lenses of the third lens group are aspherical lenses;

the fourth lens group comprises seven lenses, and three or four lenses among the seven lenses of the fourth lens group are aspherical lenses; and the fifth lens group comprises two lenses.

11. The lithography projection objective of claim 1, wherein a light incident surface of any lens in the fifth lens group and a light emitting surface of any lens in the fifth lens group are plane.

12. The lithography projection objective of claim 1, wherein the first lens group comprises an anamorphic lens compensator, the anamorphic lens compensator is a lens in the first lens group, a range of an aperture-thickness ratio of the anamorphic lens compensator is 9 to 10, and the aperture-thickness ratio is a ratio of a maximum aperture of a lens to a thickness of a lens; and an effective aperture of a first surface of the anamorphic lens compensator is $\phi_1$, and an effective aperture of a second surface of the anamorphic lens compensator is $\phi_2$, wherein the second surface of the anamorphic lens compensator is located between the first surface of the anamorphic lens compensator and the second lens group, and $\phi_2 - \phi_1 > 20$ mm.

13. The lithography projection objective of claim 1, wherein light emitted by an argon fluoride (ArF) excimer laser and light emitted by a krypton fluoride (KrF) excimer laser are applicable to the lithography projection objective.

14. The lithography projection objective of claim 1, wherein a maximum image-side numerical aperture of the lithography projection objective is 0.82.

15. The lithography projection objective of claim 1, wherein an object-image conjugate distance of the lithography projection objective is less than or equal to 1100 mm.

* * * * *